US005780346A

United States Patent [19]

Arghavani et al.

[11] Patent Number: 5,780,346
[45] Date of Patent: Jul. 14, 1998

[54] N₂O NITRIDED-OXIDE TRENCH SIDEWALLS AND METHOD OF MAKING ISOLATION STRUCTURE

[75] Inventors: Reza Arghavani, Aloha; Robert S. Chau, Beaverton; Simon Yang; John Graham, both of Portland, all of Oreg.

[73] Assignee: Intel Corporation, Santa Clara, Calif.

[21] Appl. No.: 775,571

[22] Filed: Dec. 31, 1996

[51] Int. Cl.⁶ .................................................. H01L 21/76
[52] U.S. Cl. ........................ 438/296; 438/437; 438/775; 148/33.3
[58] Field of Search ............................ 438/296, 435, 438/437, 775, 227; 148/33.3; 257/510

[56] References Cited

U.S. PATENT DOCUMENTS

| | | |
|---|---|---|
| 3,976,524 | 8/1976 | Feng . |
| 4,871,689 | 10/1989 | Bergami et al. . |
| 4,960,727 | 10/1990 | Mattox . |
| 5,004,703 | 4/1991 | Zdebel et al. . |
| 5,387,540 | 2/1995 | Poon et al. . |

FOREIGN PATENT DOCUMENTS

| | | |
|---|---|---|
| 360132341 | 7/1985 | Japan . |
| 402010851 | 1/1990 | Japan . |
| 407307382 | 11/1995 | Japan . |

Primary Examiner—George R. Fourson
Attorney, Agent, or Firm—Blakely, Sokoloff, Taylor & Zafman

[57] ABSTRACT

A method of forming an isolation structure in a semiconductor substrate is described. A trench is first etched into a semiconductor substrate. A first oxide layer is then formed with the trench. The first oxide layer is subjected to a nitrogen-oxide gas ambient and is annealed to form an oxy-nitride surface on the first oxide layer and a silicon-oxynitride interface between the first oxide layer and the semiconductor substrate. A second oxide layer is then deposited over the oxy-nitride surface of the first oxide layer. The method and isolation structure of the present invention prevents dopant outdiffusion, reduces trench stresses, allows more uniform growth of thin gate oxides, and permits the use of thinner gate oxides.

30 Claims, 7 Drawing Sheets

N₂O NITRIDED-OXIDE TRENCH SIDEWALLS AND METHOD OF MAKING ISOLATION STRUCTURE

BACKGROUND OF THE INVENTION

1. Field of the Invention

The present invention relates to semiconductor processing and more particularly to a trench isolation process which prevents boron outdiffusion and decreases stress.

2. Background Information

As the demand for cheaper, faster, lower power consuming microprocessors increases, so must the device packing density of the integrated circuit (IC). Very Large Scale Integration (VLSI) techniques have continually evolved to meet the increasing demand. All aspects of the IC must be scaled down to fully minimize the dimensions of the circuit. In addition to minimizing transistor dimensions, one must minimize the dimensions of the field regions (or isolation regions) which serve to physically and electrically isolate one semiconductor device from an adjacent semiconductor device on a semiconductor substrate so that each device can operate independently of the other.

In general, the number of transistors which can be built on a silicon substrate is limited only by the size of the transistors and the available surface area of the silicon substrate. Transistors can only be built in active regions of a silicon substrate while isolation regions of the substrate are dedicated to separating active regions from one another. Therefore, to maximize the number of transistors on the surface of a silicon substrate, it is necessary to maximize the available active surface area of the substrate. The active surface area is maximized by, in turn, minimizing the isolation regions of the silicon substrate. In order to fully minimize an isolation region, the width of the isolation region should approach the minimum width printable by a given photolithographic technology.

One technology which has been developed to form such isolation regions is known as trench technology. A trench isolation structure is formed in a silicon substrate by etching a trench region into the substrate and subsequently refilling this trench with some type of trench fill material. Thereafter active regions adjacent to the trench isolation structure are available for conventional semiconductor processing to form transistors or the semiconductor device.

The material used to fill the trench formed in the semiconductor substrate plays an important roll in the robustness and isolation quality of the trench isolation structure. Typically the trench is filled with a dielectric material such as, for example, a silicon dioxide (oxide).

One example of a prior art method for forming trench isolation structures is illustrated in FIG. 1a–k. FIG. 1a illustrates a semiconductor substrate 110 with a pad oxide layer 120 and a polish stop layer 130 deposited thereon. Polish stop layer may be made of a nitride, for example silicon nitride. Polish stop layer 130 and pad oxide layer 120 are then patterned and etched to form an opening 140, as is illustrated in FIG. 1b. It will be obvious to one with ordinary skill in the art that polish stop layer 130 and pad oxide layer 120 may be patterned using well known photolithographic masking and etching techniques (not shown).

After polish stop layer 130 and pad oxide 120 are patterned the substrate 110 is etched to form a trench 145, as is illustrated in FIG. 1c. After trench 145 is etched however the sidewalls of the trench are not clean, thus a preclean step is performed to remove debris from the trench sidewalls. Next, a sacrificial oxide 150 is formed in the trench, as is illustrated in FIG. 1d. Sacrificial oxide 150 is then removed leaving the sidewalls clean and free of debris, as is illustrated in FIG. 1e.

Trench sidewall oxide 160 is then formed in the trench, as is illustrated in FIG. 1f. Trench sidewall oxide 160 is a higher quality (or is purer) than sacrificial oxide 150 and remains in the trench. Next the trench is filled in with an oxide to form trench fill oxide 170, as is illustrated in FIG. 1g. It should be noted and it will be obvious to one with ordinary skill in the art that the trench may be filled with oxide using chemical vapor deposition (CVD) techniques. After the trench is filled, trench fill oxide 170 is then polished in order to remove the excess oxide above polish stop layer 130, as is illustrated in FIG. 1h.

As illustrated in FIG. 1i, polish stop layer 130 is then removed. It should be noted and it will be obvious to one with ordinary skill in the art that polish stop layer 130 may be removed using conventional etch techniques. After polish stop layer 130 is removed, an etch-back step is performed in order to isolate trench sidewall oxide 160 and trench fill oxide 170 within the trench, as is illustrated in FIG. 1j. It should be noted and it will be obvious to one with ordinary skill in the art that this etch-back step may be performed using chemical mechanical polishing (CMP) techniques.

There are several problems that result from the use of trench isolation technology. One such problem is the formation of the "birds beak" or sharp top corners 190 of the trench, as is illustrated in FIG. 1j. Sharp top corners 190 of the trench may carry stronger electromagnetic fields (e-fields). Sharp top corners of the trench cause problems when later forming active regions on either side of the trench. For example, when forming a transistor adjacent to the trench a gate insulating oxide layer is grown over the substrate and over the trench, because the top corners of the trench are sharp, the gate oxide layer cannot be grown with a uniform thickness. As illustrated in FIG. 1k, the thickness of the thin gate oxide layer 180 around the top corners 190 becomes very thin. The thin gate oxide layer may break down if subjected to high electromagnetic field. For example, once a transistor is formed and is functioning the sharp top corners 190 create a high e-field and the thin gate oxide 180 may be subject to failure causing undesirable parasitic capacitances and leakage voltages which degrade device performance.

Sharp top corners also cause a problem when filling the trench. As stated above, the trench is generally filled using chemical vapor deposition (CVD) techniques to fill the trench with materials such as an oxide, polysilicon, or a combination thereof. CVD processes subject the structure to plasma which also induces (or creates) an electric field around the sharp corners causing a non-uniform deposition process and may create gaps or voids in the trench fill.

Another problem that results from trench isolation technology is the outdiffusion of dopants from the semiconductor device region, for example from the source 220 and drain 230 regions of a transistor (illustrated in FIG. 2), into the trench 245 region. Outdiffusion is especially prominent in N-channel transistors that have narrow widths, thus as device dimensions decrease (e.g. narrower widths) the susceptibility to outdiffusion increases. Outdiffusion of the dopants from the device region has several effects. It is well known in the art that the higher the dopant concentration the higher the threshold voltage of the transistor. Thus, outdiffusion of the dopants from the device region into the channel reduces the dopant concentration of the transistor and thereby decreases the threshold voltage of the device. For example, if the dopants in the region 250 adjacent source region 220 outdiffuse into the trench 245, then the dopant concentration in region 250 will be less than the dopant concentration in region 255. Therefore, the threshold voltage in region 250 will be less than the threshold voltage in the region 255.

The outdiffusion of dopants may also increase the off-leakage current. The off-leakage current is the parasitic (i.e. bad or unwanted) current that flows from the source 220 to the drain 230 of the transistor when the voltage applied to the gate 240 is zero ($V_g=0$), and the drain voltage ($V_d$) is at power supply voltage ($V_{cc}$) (i.e. in general a power supply may be $V_{cc}=1.8$ volts). It is desirable for the off-leakage current to be minimized such that the voltage at the source is zero ($V_s=0$). However, if the dopants outdiffuse into the trench, for example dopants near the source region (for example, dopants from region 250) diffuse into the trench, then the threshold voltage near the source region becomes less than the threshold voltage in the channel and drain regions and may allow parasitic current to flow from the source 220 to the drain 230.

One prior art method used to decrease the outdiffusion of the dopants into the trench is to treat the sidewall oxide 160 with a nitrogen plasma in order to transform the surface of sidewall oxide 160 into a nitrogen-rich oxide surface. By creating a nitrogen-rich oxide surface the dopants do not diffuse as easily into the trench. However, it has been found that the use of just a nitrogen plasma does not create a sufficient barrier to control the outdiffusion of the dopants. The use of nitrogen plasma creates a barrier in some regions but nitrogen alone does not react enough with the oxide layer in order to form a complete barrier. Thus, outdiffusion of the dopants still occurs and parasitic currents continue to be a problem.

A further problem with the prior art isolation techniques described above is that they work for devices which use a thin gate oxide layer of greater than 32 Å, however as device characteristics shrink the above described trench isolation technology fails as the gate oxides become thinner (32 Å or less). In other words, as device dimensions move from 0.35 µ technology to 0.25 µ technology and lower prior art trench isolation technology is inadequate.

Thus, what is needed is a trench isolation structure and a method for making that structure that will prevent dopant outdiffusion, will also allow uniform deposition of thin gate oxides, and will permit the use of thinner gate oxides.

SUMMARY OF THE INVENTION

A method of forming an isolation structure in a semiconductor substrate is described. A trench is first etched into a semiconductor substrate. A first oxide layer is then formed with the trench. The first oxide layer is subjected to an $N_2O$ nitridation step in a nitrogen-oxide ($N_2O$) gas ambient to form an oxy-nitride surface on the first oxide layer and a silicon oxy-nitride interface between the semiconductor substrate and the first oxide layer. A second oxide layer is then deposited over the oxy-nitride surface of the first oxide layer.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method for forming $N_2O$ nitrided-oxide trench sidewalls to prevent boron outdiffusion and decrease stress is disclosed. In the following description, numerous specific details are set forth such as specific materials, process parameters, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a trench isolation structure and a method for making that structure that will prevent dopant outdiffusion, will also allow uniform deposition of thin gate oxides, and will permit the use of thinner gate oxides. In the manufacture of semiconductor devices the present invention is employed to form a barrier between the trench and an active region so that the dopants of the active region are not able to outdiffuse into the trench.

Figure 1A:
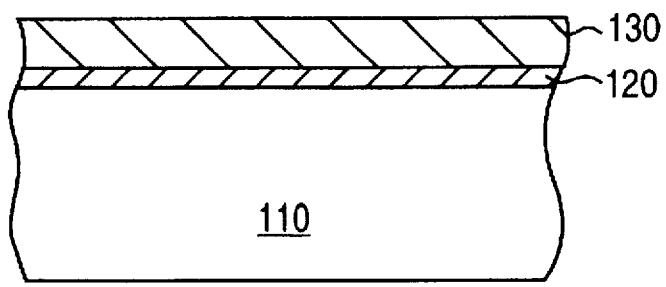
FIG. 1a illustrates a cross-sectional view of a semiconductor substrate with a pad oxide layer and a polish stop layer deposited thereon.
Figure 1B:
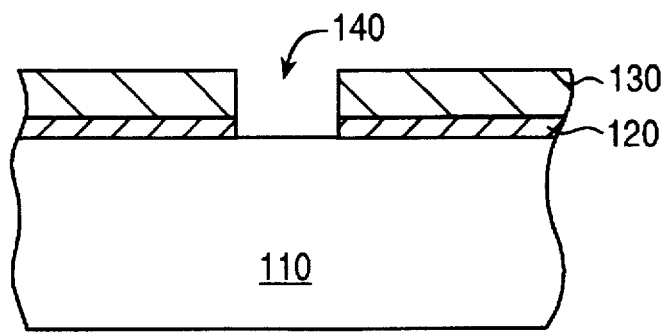
FIG. 1b illustrates a cross-sectional view of the structure in FIG. 1a after the pad oxide layer and polish stop layer have been patterned.
Figure 1C:
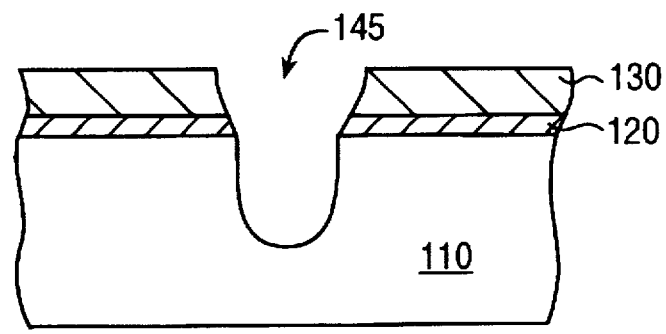
FIG. 1c illustrates a cross-sectional view of the structure in FIG. 1b after a trench has been etched in the semiconductor substrate.
Figure 1D:
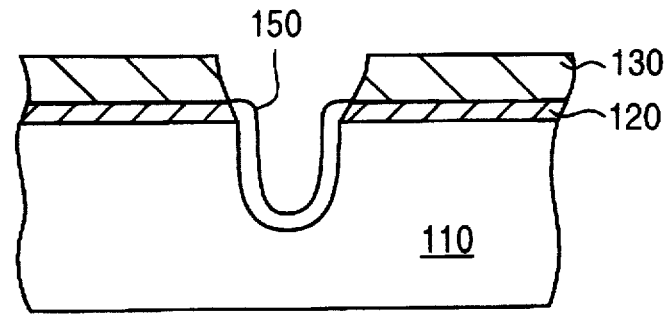
FIG. 1d illustrates a cross-sectional view of the structure in FIG. 1c after a sacrificial oxide has been deposited on the trench.
Figure 1E:
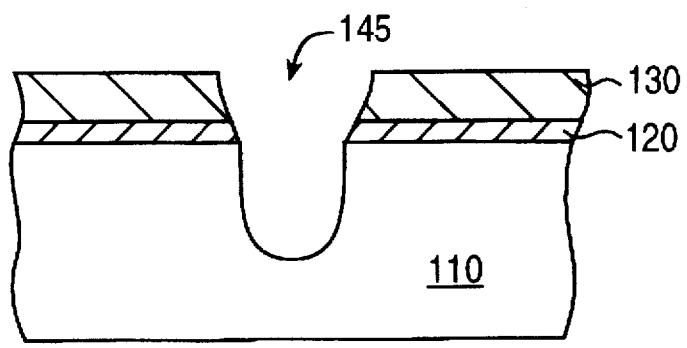
FIG. 1e illustrates a cross-sectional view of the structure in FIG. 1d after a preclean step has been performed removing the sacrificial oxide.
Figure 1F:
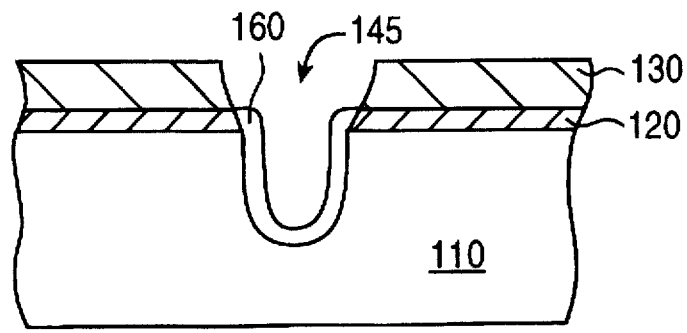
FIG. 1f illustrates a cross-sectional view of the structure in FIG. 1e after a trench sidewall oxide has been formed.
Figure 1G:
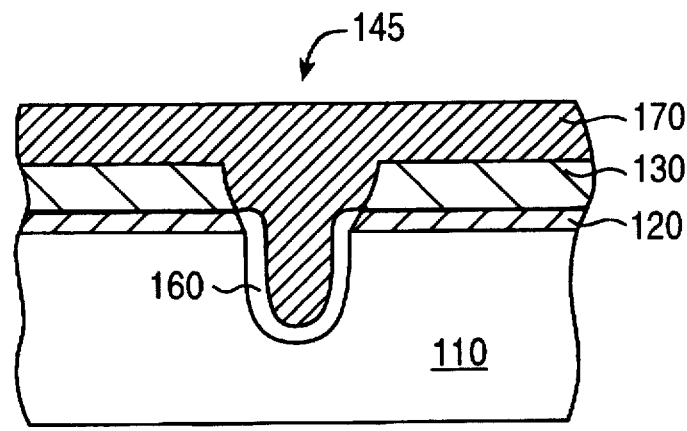
FIG. 1g illustrates a cross-sectional view of the structure in FIG. 1f after the trench has been completely filled with an oxide.
Figure 1H:
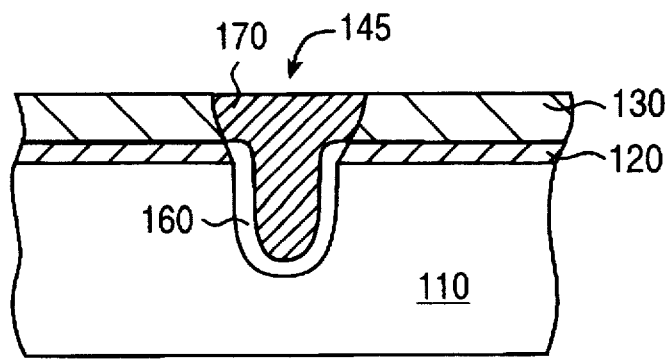
FIG. 1h illustrates a cross-sectional view of the structure in FIG. 1g after a polish step has been performed.
Figure 1I:
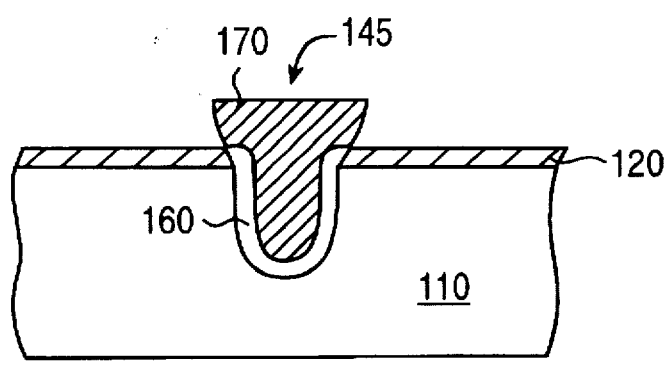
FIG. 1i illustrates a cross-sectional view of the structure in FIG. 1h after the polish stop layer has been removed.
Figure 1J:
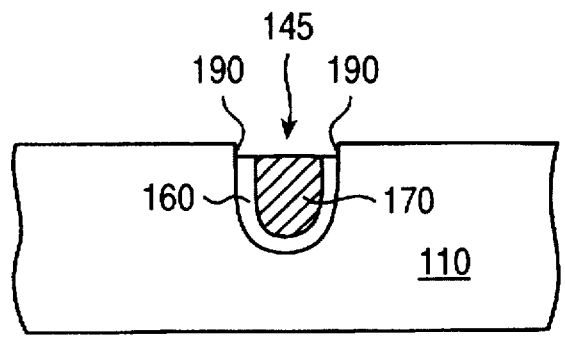
FIG. 1j illustrates a cross-sectional view of the structure in FIG. 1i after an etch-back step is performed.
Figure 1K:
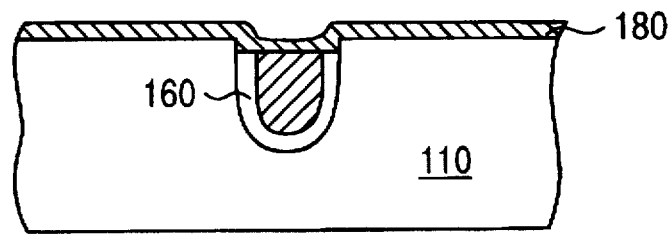
FIG. 1k illustrates a cross-sectional view of the structure in FIG. 1j after a thin gate oxide has been grown.
Figure 2:
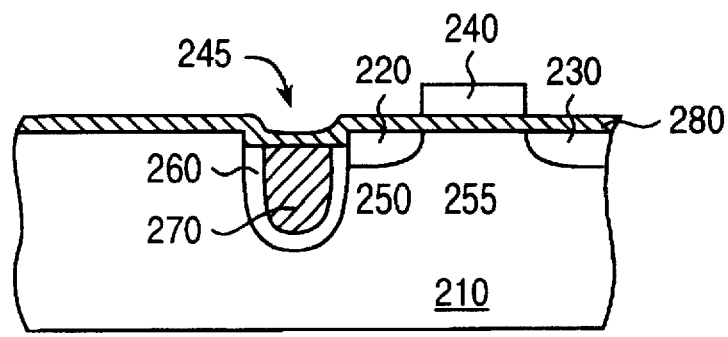
FIG. 2 illustrates a prior art trench isolation structure adjacent an active region.
Figure 3A:
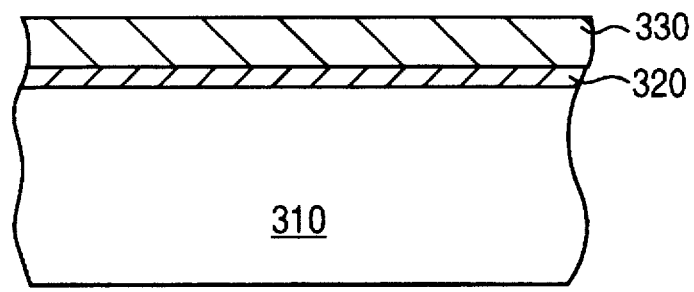
FIG. 3a illustrates a cross-sectional view of a semiconductor substrate with a pad oxide layer and a polish stop layer deposited thereon.
Figure 3B:
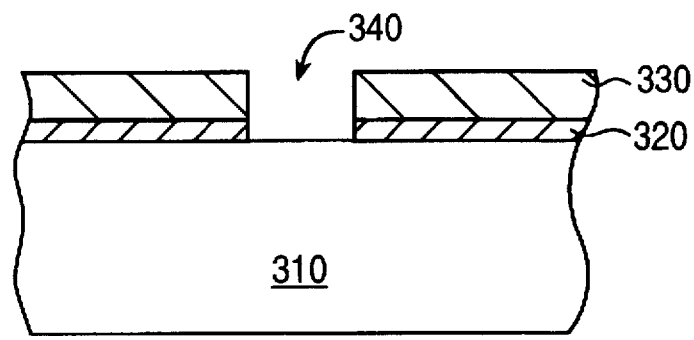
FIG. 3b illustrates a cross-sectional view of the structure in FIG. 3a after the pad oxide layer and polish stop layer have been patterned.

When forming a semiconductor device an isolation trench may be formed adjacent an active region in order to isolate one active region from another. FIGS. 3a-k illustrate one embodiment of the present invention. FIG. 3a illustrates a semiconductor substrate 310 with a pad oxide layer 320 and a polish stop layer 330 deposited thereon. Semiconductor substrate 310 may be made up of silicon and polish stop layer 330 may be made up of a nitride, for example silicon nitride. In one embodiment of the present invention polish stop layer 330 has a thickness of approximately 1800 Å and pad oxide 320 has a thickness of approximately 100 Å. Polish stop layer 330 and pad oxide layer 320 are then patterned an etched to form an opening 340, as is illustrated in FIG. 3b. It will be obvious to one with ordinary skill in the art that polish stop layer 330 and pad oxide layer 320 may be patterned using well known photolithographic masking and etching techniques (not shown).

Figure 3C:
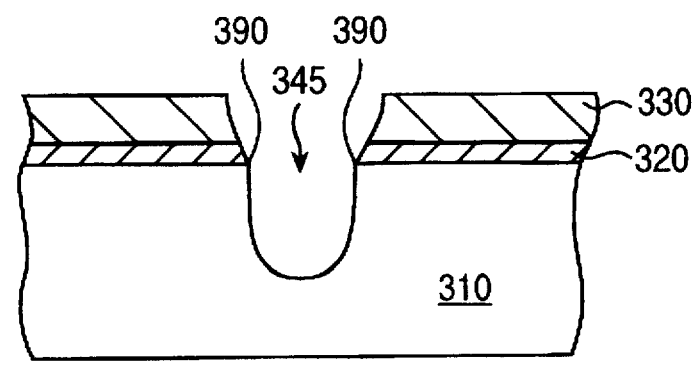
FIG. 3c illustrates a cross-sectional view of the structure in FIG. 3b after a trench has been etched in the semiconductor substrate.
Figure 3D:
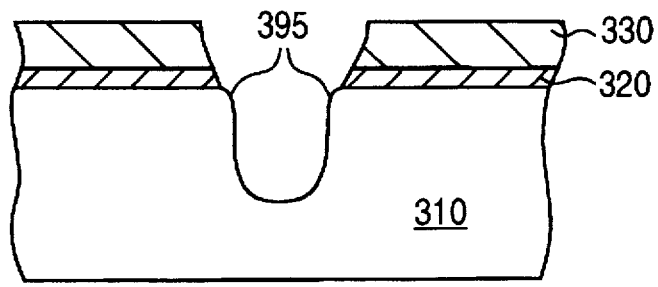
FIG. 3d illustrates a cross-sectional view of the structure in FIG. 3c after a preclean step has been performed which rounds the top corners of the trench.

After polish stop layer 330 and pad oxide 320 are patterned the substrate 310 is etched to form a trench 345, as is illustrated in FIG. 3c. After trench 345 is etched however the sidewalls of the trench are not clean, thus a preclean step is performed to remove debris from the trench sidewalls. The trench preclean step is performed using a chemistry made up of SC1, SC2, and HF. It should be noted that, Standard Clean 1 (SC1) is a combination of $NH_4OH$, $H_2O_2$, and $H_2O$; and Standard Clean 2 (SC2) is a combination of HCl, $H_2O_2$, and $H_2O$. The preclean step is performed for a duration long enough that the preclean chemistry will consume some of the silicon semiconductor substrate 310. The consumption of the silicon during the preclean step rounds the sharp top corners 390 of the trench reducing the "birds beak" effect and forming round top corners 395, as illustrated in FIG. 3d. Thus, the longer the preclean step the greater the roundness of the top corners 395 of the trench. Because the top corners of trench 345 are rounded they will not tend to carry high electromagnetic fields and will permit the deposition of a more uniform thin gate oxide 380 (illustrated in FIG. 3k) for the formation of a semiconductor device in the active region adjacent the trench.

Figure 3E:
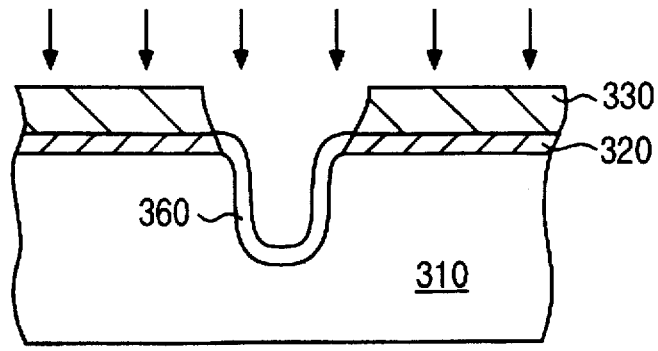
FIG. 3e illustrates a cross-sectional view of the structure in FIG. 3d during an $N_2O$ nitridation and anneal step.

Trench sidewall oxide 360 is then formed in the trench, as is illustrated in FIG. 3e. Trench sidewall oxide 360 may be grown at a temperature in the range of approximately 900°–1050° C. to a thickness in the range of approximately 150–350 Å. In one preferred embodiment of the present invention trench sidewall oxide 360 is a thermal oxide grown at a temperature of approximately 1000° C. and to a thickness of approximately 250 Å.

Figure 3F:
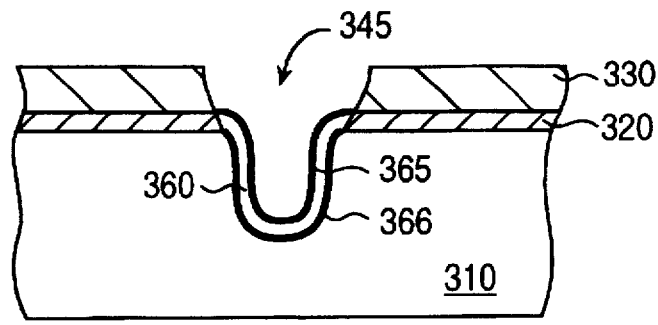
FIG. 3f illustrates a cross-sectional view of the structure in FIG. 3e after the oxy-nitride surface and silicon-oxy-nitride interface have been formed.

After the trench sidewall oxide 360 is formed then trench sidewall oxide 360 is subjected to an $N_2O$ nitridation step in a nitrogen-oxide ($N_2O$) gas ambient and anneal step, as illustrated in FIG. 3e. The nitridation and anneal steps form an oxy-nitride surface on the first oxide layer which reduces the stresses in the trench and a silicon oxy-nitride interface (barrier) between the semiconductor substrate and the first oxide layer which helps to eliminate dopant outdiffusion from the active region that is adjacent to the trench 345. The anneal step may be performed in a VDF furnace with an $N_2O$ gas ambient at a temperature of 900° C. or more for a duration in the range of approximately 5–35 minutes. In one embodiment of the present invention the $N_2O$ gas ambient and anneal is performed at a temperature of approximately 1000° C. for a duration of approximately 15 minutes. The nitrided-oxide reacts with the trench sidewall oxide to create an oxy-nitride surface 365 on the surface of trench sidewall oxide 360 and a silicon-oxy-nitride interface 366 between the silicon semiconductor substrate 310 and trench sidewall oxide 360, as is illustrated in FIG. 3f.

Using an $N_2O$ gas ambient reacts with more of the surface than using just a nitrogen plasma and therefore creates a better and more substantial oxy-nitride surface on the trench sidewall oxide to prevent stresses and also creates a silicon-oxy-nitride interface between the trench sidewall oxide and silicon semiconductor substrate that will act as a barrier and prevent dopant outdiffusion from the active region. Using just a nitrogen plasma never makes a good oxy-nitride or a silicon-oxy-nitride because the chemistry just does not take place. However, using a nitrided-oxide allows the formation of a good oxy-nitride and silicon-oxy-nitride due to the good chemical reaction between $N_2O$ and the trench sidewall oxide and the silicon semiconductor substrate.

Figure 3G:
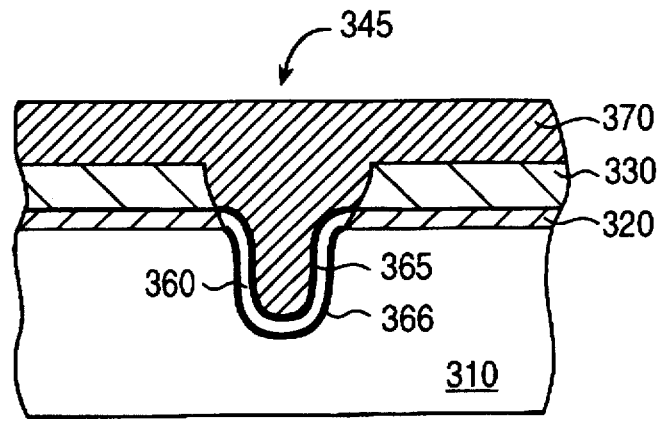
FIG. 3g illustrates a cross-sectional view of the structure in FIG. 3f after the trench has been completely filled with an oxide.

Next the trench is filled in with an oxide to form trench fill oxide 370, as is illustrated in FIG. 3g. It should be noted and it will be obvious to one with ordinary skill in the art that the trench may be filled with oxide using chemical vapor deposition (CVD) techniques. For one embodiment of the present invention, the thickness of trench fill oxide 370 is highly dependent on the dimensions of the trench to be filled. In addition, the thickness of the trench fill oxide 370 should be chosen to provide adequate planarization and process control during the subsequent planarization etch back step. For another embodiment of the present invention, the trench fill oxide 370 may be formed by processes such as, for example, plasma etch CVD (PECVD), thermal CVD (ThCVD) or low pressure CVD (LPCVD), and may be formed using reactant species other than or in addition to TEOS and oxygen. For example, trench fill oxide 370 may comprise a dopant to form phosphosilicate glass (PSG), borosilicate glass (BSG), or borophosphosilicate glass (BPSG).

An important aspect to consider when selecting the material used to fill the trench is that the material selected should be different than the underlying material used to mask the surface of the semiconductor substrate. For example, in one embodiment of the present invention in which a nitride layer is used as polish stop layer 330, the material used to fill the trench is preferably not a nitride. In this manner, processes and chemistries may be implemented during the subsequent planarization etch back process described below to ensure that the etch back of the trench filled material stops on the underlying masking layer. Note that for other embodiments of the present invention, the single CVD oxide layer used to fill the trench may be replaced by a multi-layer stack of trench materials suitable for the particular application in which they are employed.

Figure 3H:
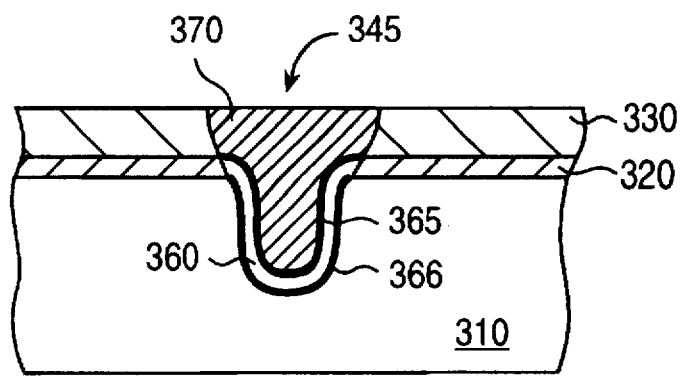
FIG. 3h illustrates a cross-sectional view of the structure in FIG. 3g after a polish step has been performed.
Figure 3I:
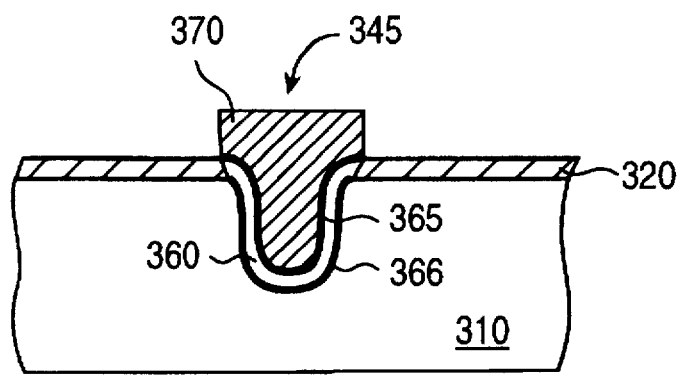
FIG. 3i illustrates a cross-sectional view of the structure in FIG. 3h after the polish stop layer has been removed.
Figure 3J:
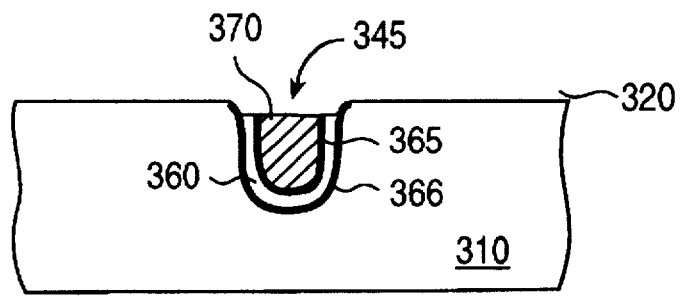
FIG. 3j illustrates a cross-sectional view of the structure in FIG. 3i after an etch-back step is performed.

After the trench is filled, trench fill oxide 370 is then polished (or planarized) in order to remove the excess oxide above polish stop layer 330, as is illustrated in FIG. 3h. As illustrated in FIG. 3i, polish stop layer 330 is then removed. It should be noted and it will be obvious to one with ordinary skill in the art that polish stop layer 330 may be removed using conventional etch techniques. After polish stop layer 330 is removed, an etch-back step is performed in order to isolate trench sidewall oxide 360 and trench fill oxide 370 within the trench, as is illustrated in FIG. 3j. It should be noted and it will be obvious to one with ordinary skill in the art that this etch-back step may be performed using chemical mechanical polishing (CMP) techniques.

Figure 3K:
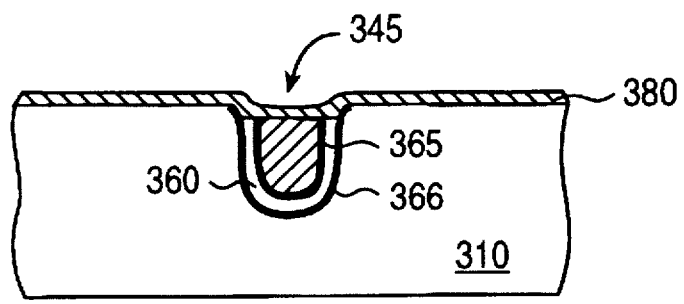
FIG. 3k illustrates a cross-sectional view of the structure in FIG. 3j after a thin gate oxide has been grown.

The present invention solves several problems that occur in the prior art as a result of the use of trench isolation technology. One such problem that is solved in by the present invention is the "birds beak" or sharp top corners effect. As stated earlier the top corners 390 of the trench 345 are rounded during processing to form rounded top corners 395. Thus, rounded top corners 395 will not carry strong electromagnetic fields (e-fields). Because the present invention produces rounded top corners 395, the present invention also solves some of the problems associated with sharp top corners in the formation of active regions on either side of the trench. For example, when forming a transistor adjacent to the trench a gate insulating oxide layer is grown over the substrate and over the trench, and since the top corners of the trench of the present invention are rounded, the gate oxide layer 380 is grown with a uniform thickness. As illustrated in FIG. 3k, the thickness of the thin gate oxide layer 380 at rounded top corners 395 is the same thickness (i.e. uniform thickness) as the gate oxide layer that lies on the horizontal surfaces of trench 345 and substrate 310. Thus, the thin gate oxide layer 380 is not as susceptible to break down when subjected to high electromagnetic fields. For example, once a transistor is formed and is functioning the rounded top corners 395 will more evenly distribute (or will not collect) e-fields and therefore will help prevent undesirable parasitic capacitances and leakage voltages which degrade device performance.

Rounded top corners 395 will also aid the process of filling the trench. As stated above, the trench is generally filled using chemical vapor deposition (CVD) techniques to fill the trench with materials such as an oxide. Because the top corners of trench 345 are rounded the CVD processes which subject the structure to plasma that tends to induce (or create) an electric field around sharp top corners will not induce such e-fields around the rounded top corners 395 of the present invention. Thus, the rounded top corners of the present invention enable a uniform deposition process and decreases the likelihood of the formation of gaps or voids in the trench fill.

Figure 4:
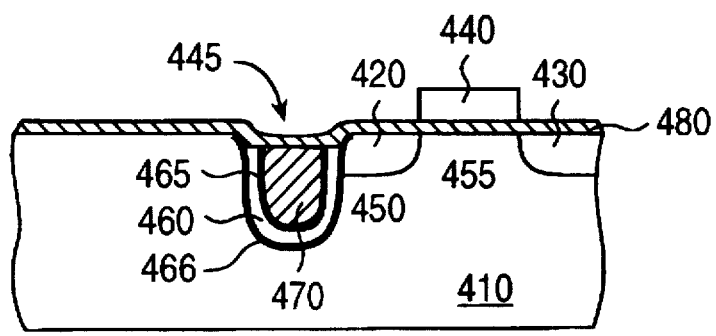
FIG. 4 illustrates an embodiment of a trench isolation structure of the present invention adjacent an active region.

The present invention also solves the problem associated with trench isolation technology of trench isolation stresses and outdiffusion of dopants from the semiconductor device region, for example from the source 420 and drain 430 regions of a transistor (illustrated in FIG. 4), into the trench 445 region. In particular the present invention is able to prevent the outdiffusion of boron dopants in N-channel transistors. As stated earlier, Outdiffusion is especially prominent in N-channel transistors that have narrow widths, thus as device dimensions decrease (e.g. narrower widths) the susceptibility to outdiffusion increases.

The present invention decreases or eliminates trench stresses and boron outdiffusion from N-channel transistors by creating an oxy-nitride surface 465 and a silicon-oxy-nitride interface 466. Oxy-nitride surface 465 reduces the stresses present in the trench isolation structures between the oxide layers. Silicon-oxy-nitride interface 466 prevents the boron dopants from diffusing into the trench sidewall oxide 460 and trench fill oxide 470. Thus, if the dopant concentration of the active region remains stable the threshold voltage in the active region remains stable and is less susceptible to parasitic currents that degrade device performance. For example, if the dopants in the region 450 adjacent source region 420 are unable to outdiffuse into the trench 445, then the dopant concentration in region 450 will remain approximately the same as the dopant concentration in region 455. Therefore, the threshold voltage in region 450 will remain approximately the same as the threshold voltage in the region 455.

Controlling or preventing the outdiffusion of dopants using the present invention will also decrease the off-leakage current. As stated earlier, the off-leakage current is the parasitic (i.e. bad or unwanted) current that flows from the source 420 to the drain 430 of the transistor when the voltage applied to the gate 440 is zero ($V_g=0$), and the drain voltage ($V_d$) is at power supply voltage ($V_{cc}$) (i.e. in general a power supply may be $V_{cc}=1.8$ volts). It is desirable for the off-leakage current to be minimized such that the voltage at the source is zero ($V_s=0$). Since the use of the present invention prevents the outdiffusion of the dopants into the trench, for example dopants near the source region (for example, dopants from region 450) are not longer able to diffuse into the trench, then the threshold voltage near the source region will remain approximately the same as the threshold voltage in the channel and drain regions therefore parasitic currents will not flow from the source 420 to the drain 430.

Another advantage of the present invention is that it enables the use of thinner gate oxide layers than prior art techniques. Due to the enablement of a more uniform growth of the gate oxide and the prevention of outdiffusion of dopants into the trench thinner gate oxides on the order of 32 Å or less may be used. Thus, as device characteristics shrink, for example move from 0.35 μ technology to 0.25 μ technology and lower, the trench isolation technology of the present invention enables the use of thinner gate oxides, for example 32 Å or less.

Thus, a method for forming $N_2O$ nitrided-oxide trench sidewalls to prevent boron outdiffusion and decrease stress has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method of forming an isolation structure in a semiconductor substrate comprising the steps of:

a) etching a trench in said semiconductor substrate;

b) forming a first oxide layer within said trench;

c) subjecting said first oxide layer to a nitrogen-oxide ($N_2O$) gas ambient to form an oxy-nitride surface on said first oxide layer and a silicon-oxy-nitride interface between said first oxide layer and said semiconductor substrate; and d) depositing a second oxide layer over said oxy-nitride surface of said first oxide layer.

2. The method of claim 1 further comprising the step of performing a trench preclean after said step of etching said trench and prior to said step of forming said first oxide layer.

3. The method of claim 1 further comprising the step of performing a chemical mechanical polishing (CMP) etch-back step to isolate said first and second oxide layers within said trench.

4. The method of claim 1 wherein said first oxide layer is formed by a method including growing a thermal oxide within said trench.

5. The method of claim 1 wherein said second oxide layer is deposited by a chemical vapor deposition (CVD) process.

6. A method of forming an isolation structure in a semiconductor substrate comprising the steps of:
   a) etching a trench in said semiconductor substrate;
   b) growing a thermal oxide within said trench to form a first oxide layer;
   c) subjecting said first oxide layer to a nitrogen-oxide ($N_2O$) gas ambient to form an oxy-nitride surface on said first oxide layer and a silicon-oxy-nitride interface between said first oxide layer and said semiconductor substrate, wherein said $N_2O$ gas ambient treatment step consumes some of said semiconductor substrate and rounds the top corners of said trench;
   d) depositing a second oxide layer over said oxy-nitride surface of said first oxide layer; and
   e) performing a chemical mechanical polishing etch-back step to isolate said first and second oxide layers within said trench.

7. The method of claim 6 wherein said second oxide layer is a substantially undoped oxide layer.

8. The method of claim 6 wherein said second oxide layer is a doped oxide selected from a group consisting of borosilicate glass (BSG), phosphosilicate glass (PSG), borophosphosilicate glass (BPSG), and any combination thereof.

9. The method of claim 6 wherein said second oxide layer is deposited by a chemical vapor deposition (CVD) process.

10. The method of claim 9 wherein the CVD process is a low pressure CVD (LPCVD) process performed using a TEOS chemistry.

11. A method of forming an isolation structure in a semiconductor substrate comprising the steps of:
    a) forming a pad oxide layer above said semiconductor substrate;
    b) forming a polish stop layer above said pad oxide layer;
    c) patterning and etching said polish stop layer and said pad oxide layer;
    d) etching a trench in said semiconductor substrate;
    e) performing a trench preclean step;
    f) forming a first oxide layer within said trench to form a first trench oxide layer;
    g) subjecting said first oxide layer to a nitrogen-oxide ($N_2O$) gas ambient to form an oxy-nitride surface on said first oxide layer and a silicon-oxy-nitride interface between said first oxide layer and said semiconductor substrate, wherein said $N_2O$ gas ambient treatment step consumes some of said semiconductor substrate and rounds the top corners of said trench;
    h) depositing a second trench oxide layer over said oxy-nitride surface of said first trench oxide layer;
    i) polishing said second trench oxide layer in order to remove the portion of said second trench oxide layer above said polish stop layer;
    j) removing said polish stop layer;
    k) performing a chemical mechanical polishing etch-back step to isolate said first and second oxide layers within said trench; and
    l) forming a thin gate oxide layer over said semiconductor substrate and said trench for use in the formation of a semiconductor device.

12. The method of claim 11 wherein said semiconductor substrate comprises silicon.

13. The method of claim 11 wherein said polish stop layer comprises a nitride layer.

14. The method of claim 11 wherein said trench preclean step is performed using a chemical comprising: SC1, SC2, and HF.

15. The method of claim 11 wherein said first trench oxide layer comprises a thermal oxide.

16. The method of claim 12 wherein said $N_2O$ gas ambient treatment step consumes some of said silicon to form a silicon oxy-nitride surface and rounds the top corners of said trench.

17. The method of claim 11 wherein said second oxide layer is deposited by a chemical vapor deposition (CVD) process.

18. The method of claim 11 wherein said second trench oxide layer is a substantially undoped oxide layer.

19. The method of claim 11 wherein said second oxide layer is a doped oxide selected from a group consisting of borosilicate glass (BSG), phosphosilicate glass (PSG), borophosphosilicate glass (BPSG), and any combination thereof.

20. The method of claim 11 wherein said thin gate oxide layer has a thickness of less than 32 Å.

21. An isolation structure formed in a semiconductor substrate, said isolation structure comprising:
    a trench in said semiconductor substrate;
    a first oxide layer lining said trench, said first oxide layer having an oxy-nitride surface;
    a silicon-oxy-nitride interface between said first oxide layer and said semiconductor substrate; and
    a second oxide layer within said trench, said second oxide layer disposed directly on said oxy-nitride surface of said first oxide layer.

22. The isolation structure of claim 21 wherein said trench is a shallow trench isolation structure.

23. The isolation structure of claim 21 wherein said first oxide layer is a thermal oxide.

24. The isolation structure of claim 21 wherein said second oxide layer is a substantially undoped oxide.

25. The isolation structure of claim 21 wherein said second oxide layer is a doped oxide selected from a group consisting of: borosilicate glass (BSG), phosphosilicate glass (PSG), borophosphosilicate glass (BPSG), and any combination thereof.

26. A semiconductor device comprising:
    an isolation structure formed in a semiconductor substrate, said isolation structure comprising:
    a trench in said semiconductor substrate;
    a first oxide layer lining said trench, said first oxide layer having an oxy-nitride surface;
    a silicon-oxy-nitride interface between said first oxide layer and said semiconductor substrate; and
    a second oxide layer within said trench, said second oxide layer disposed directly on said oxy-nitride surface of said first oxide layer; and
    a transistor formed adjacent said isolation structure, said transistor comprising:
    a thin gate oxide layer, said thin gate oxide layer having a thickness of less than 32 Å.

27. The isolation structure of claim 26 wherein said trench is a shallow trench isolation structure.

28. The isolation structure of claim 26 wherein said first oxide layer is a thermal oxide.

29. The isolation structure of claim 26 wherein said second oxide layer is a substantially undoped oxide.

30. The isolation structure of claim 26 wherein said second oxide layer is a doped oxide selected from a group consisting of: borosilicate glass (BSG), phosphosilicate glass (PSG), borophosphosilicate glass (BPSG), and any combination thereof.

* * * * *